(12) United States Patent
Yuzurihara et al.

(10) Patent No.: US 9,160,240 B2
(45) Date of Patent: Oct. 13, 2015

(54) DC POWER SUPPLY DEVICE, AND CONTROL METHOD FOR DC POWER SUPPLY DEVICE

(75) Inventors: Itsuo Yuzurihara, Yokohama (JP); Toshiyuki Adachi, Yokohama (JP); Shinichi Kodama, Yokohama (JP)

(73) Assignee: KYOSAN ELECTRIC MFG. CO., LTD., Yokohama-shi (JP)

(*) Notice: Subject to any disclaimer, the term of this patent is extended or adjusted under 35 U.S.C. 154(b) by 0 days.

(21) Appl. No.: 14/416,474

(22) PCT Filed: Sep. 5, 2012

(86) PCT No.: PCT/JP2012/072602
§ 371 (c)(1),
(2), (4) Date: Jan. 22, 2015

(87) PCT Pub. No.: WO2014/038013
PCT Pub. Date: Mar. 13, 2014

(65) Prior Publication Data
US 2015/0180346 A1    Jun. 25, 2015

(51) Int. Cl.
*H05B 31/26* (2006.01)
*H02M 3/335* (2006.01)
(Continued)

(52) U.S. Cl.
CPC ............. *H02M 3/33507* (2013.01); *H01T 1/02* (2013.01); *H01T 15/00* (2013.01); *H02J 1/00* (2013.01); *H05H 1/46* (2013.01); *H05H 1/48* (2013.01); *H05H 2001/4682* (2013.01)

(58) Field of Classification Search
CPC .......... H02M 3/33507; H02M 3/3353; H02M 3/33576; H05H 1/46; H05H 2001/4682; H05H 1/48; H05H 7/001
See application file for complete search history.

(56) References Cited

U.S. PATENT DOCUMENTS 5,822,847 A    10/1998    Arakawa et al.
7,304,436 B2 *  12/2007   Cho .............................. 315/167
(Continued)

FOREIGN PATENT DOCUMENTS

JP    58-93474 A    6/1983
JP    8-67963 A     3/1996
(Continued)

OTHER PUBLICATIONS

Nakamura et al., "ARC Suppressing Unit (Pulse Generator) for Sputtering Power Supply, GEXUS-P30", Origin Technical Journal, No. 73, 2010, pp. 1-7; English Abstract; cited in the Specification.
(Continued)

*Primary Examiner* — Jany Richardson
(74) *Attorney, Agent, or Firm* — Westerman, Hattori, Daniels & Adrian, LLP

(57) ABSTRACT

A phase of the pulse control signal upon restarting is synchronized with the phase of the pulse control signal upon suspending, thereby suppressing fluctuations of output voltage in each phase of the inverter upon restarting and further suppressing fluctuations of voltage supplied to the load. Upon supplying DC power to a plasma generator, when arc discharge occurs in the plasma generator, supplying of the DC power is suspended to reduce damage on the electrodes and substrate, and further upon extinguishing of the arc discharge, supplying of the DC power is restarted. In suspending and resuming the DC output, the current flowing in the chopper upon suspending is held in the form of circulating current, and upon restarting the inverter, this circulating current is supplied to the load. Accordingly, it is possible to reduce a delay in supplying the DC power to the load, upon resuming the DC output.

16 Claims, 7 Drawing Sheets

(51) Int. Cl.
  *H05H 1/46* (2006.01)
  *H02J 1/00* (2006.01)
  *H01T 1/02* (2006.01)
  *H01T 15/00* (2006.01)
  *H05H 1/48* (2006.01)

(56) References Cited

U.S. PATENT DOCUMENTS

| | | |
|---|---|---|
| 2007/0193513 A1 | 8/2007 | Deguchi et al. |
| 2008/0048586 A1* | 2/2008 | Hasegawa et al. ............ 315/307 |
| 2011/0043771 A1* | 2/2011 | Hirao .............................. 353/85 |
| 2014/0009969 A1* | 1/2014 | Yuzurihara et al. ............. 363/17 |
| 2015/0195896 A1* | 7/2015 | Yuzurihara et al. |

FOREIGN PATENT DOCUMENTS

| | | |
|---|---|---|
| JP | 8-167500 A | 6/1996 |
| JP | 2000-346968 A | 12/2000 |
| JP | 2001-112247 A | 4/2001 |
| JP | 2001-295042 A | 10/2001 |
| JP | 2006-6053 A | 1/2006 |
| JP | 2009-59715 A | 3/2009 |
| TW | 312809 B | 8/1997 |
| TW | 200810612 A | 2/2008 |

OTHER PUBLICATIONS

International Search Report dated May 14, 2013 issued in corresponding application No. PCT/JP2012/072602.
Written Opinion of the International Searching Authority dated May 14, 2013 issued in corresponding application No. PCT/JP2012/072602.
Notification Concerning Transmittal of International Preliminary Report on Patentability (Form PCT/IB1326) of International Application No. PCT/JP2012/072602 mailed Mar. 19, 2015 with Forms PCT/IB/373, PCT/IB/338 and PCT/ISA/237.

* cited by examiner

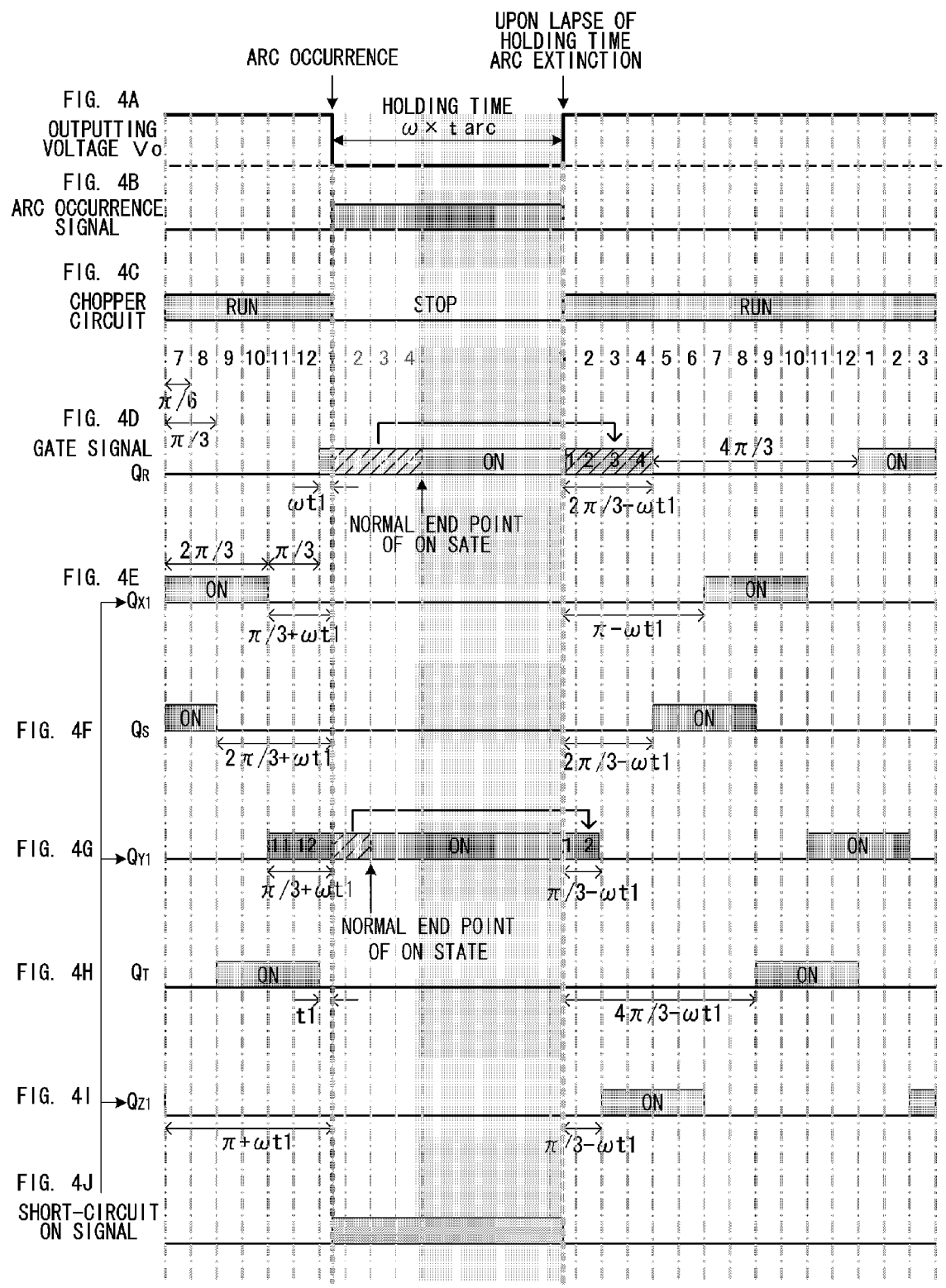

TIME OF ARC OCCURRENCE

TIME OF ARC EXTINCTION

DC POWER SUPPLY DEVICE, AND CONTROL METHOD FOR DC POWER SUPPLY DEVICE

TECHNICAL FIELD

The present invention relates to a DC power supply device, and for example, it relates to a DC power supply device used for a load such as a plasma generator, and the like, and a method for controlling the DC power supply device.

BACKGROUND ART

A DC power supply device used for a plasma generator is required to suppress excess current at the time of arc occurrence, and to extinguish the arc at a high speed. A voltage type direct power source has problems as the following; a large capacitor which is connected to output may cause a flow of excessive discharge current at the time of arc occurrence, and the output power is further increased in order to compensate for reduction of output voltage upon arc occurrence, thereby elongating the arcing time and resulting in increase of impact on the load.

When the plasma generator is assumed as the load, the direct power supply has to repeat a startup operation and a stop operation every generation of arc. Since it is difficult to perform the startup operation and the stop operation at high speed, this may lead to unstable operations. In order to address those problems above, there is suggested a DC power supply device provided with a chopper circuit, an inverter, and a voltage conversion circuit, being stable in the startup operation and being able to start and stop the load at high speed, the DC power supply device executing any one of following operations upon suspending; a stop operation in which the inverter is activated along with stopping a main switch of the chopper, a stop operation in which all the transistors of the inverter are turned on in the state where the main switch of the chopper is activated, and a stop operation in which all the transistors in the inverter are turned on along with stopping the main switch of the chopper, and the DC power supply device executing following operations at the startup timing; the inverter is activated and a pulse width of a DC voltage pulse outputted from the chopper circuit is gradually increased, thereby suppressing a large current directed to the inverter (Patent Document 1).

There is suggested an arc suppressing unit for sputtering power supply, being provided with a short-circuit switch circuit for forcing arc energy to bypass between a DC power supply device and a load, the short-circuit switch circuit is activated periodically at regular time intervals to generate inverse pulses to suppress arc discharge, and when the arc discharge occurs, the inverse pulse is forced to be generated to reduce arc energy. Then, after extinguishing arc discharge, the arc suppressing unit resumes the plasma state (Non Patent Document 1).

On the other hand, in an alternating current power supply device for supplying high-frequency power to the load, when arc discharge occurs in the plasma generator assumed as the load, there may occur a wire broken or a short in the circuit, and in addition, electrodes and substrates may be damaged. It is known that in order to suppress such occurrence of arc discharge, after detecting the arc discharge, supplying of the high-frequency power is limited or stopped for a predetermined period of time, and thereafter, the high-frequency power is resumed.

Upon suspending the supply of the high-frequency power for the predetermined period of time after detecting the arc discharge, there is a problem that if the high-frequency power supply is stopped for a time longer than necessary, maintaining of glow discharge may become difficult.

In order to address such problem as described above, there is suggested a power source for the plasma generator which supplies a pulse-like high-frequency wave after detecting the arc discharge, and controls a pulse width of the pulse-like high-frequency wave according to the magnitude of the arc discharge, thereby suppressing the arc discharge promptly after the occurrence of arc discharge and enabling activation of the plasma generator immediately after extinguishing the arc discharge (Patent Document 2).

PRIOR ART DOCUMENT

Patent Document

Patent Document 1
Japanese Unexamined Patent Application Publication No. 2006-6053 (from paragraph [0002] to paragraph [0012])
Patent Document 2
Japanese Unexamined Patent Application Publication No. 08-167500 (from paragraph [0003] to paragraph [0011])

Non Patent Document

Non Patent Document 1
Arc suppressing unit (Pulse generator) for sputtering power supply GEXUS-P30, Kenichi NAKAMURA and Hiroshi MIHOYA, Origin Technical Journal No. 73 (2010), 1-7

DISCLOSURE OF THE INVENTION

Problem to be Solved by the Invention

Among the prior arts relating to the DC power supply device, the DC power supply device provided with an inverter (Patent Document 1) restarts the plasma generator, by controlling the operation of the chopper after starting control of the inverter, at the time when the inverter is restarted after stopping the DC power supply device.

In general, when the pulse width control is performed on the inverter, pulse signals are generated, and those pulse signals are inputted as gate signals respectively in the switching elements of the inverter, thereby controlling ON/OFF operations of each switching element.

In the pulse width control of the inverter, each of the arms constituting a bridge circuit performs DC/AC conversion in such a manner that phases of ON/OFF operations in the respective switching elements establish a certain relation. In this pulse width control, in the event that the phases of the ON/OFF operations of the switching elements of the respective arms are displaced from the certain relation, fluctuations may occur in the output voltage in each of the phases being obtained, causing a problem that the voltage supplied to the load may be fluctuated.

In the DC power supply device described above, when the inverter is restarted, the phase of the pulse control signal upon restarting is set independently of the phase of the pulse control signal at the time when the inverter was stopped. Therefore, upon restarting, fluctuations occur in the output voltage in each of the phases, and there is a possibility that the voltage to be supplied to the load may also be fluctuated.

In the case where a direct current (DC) output from the DC power supply device is suspended and resumed afterwards, there is also a problem that a delay may occur during the period from restarting the inverter until supplying direct current (DC) power to the load, due to a delay time caused by a capacitive component, and the like, being provided in the DC power supply device.

An object of the present invention is to solve the conventional problems described above and it is directed to a DC power supply device provided with an inverter, allowing the phase of a pulse control signal upon restarting to synchronize with the phase of the pulse control signal upon suspending, when the inverter is restarted.

Another object of the present invention is to allow the phase of the pulse control signal upon restarting to synchronize with the phase of the pulse control signal upon suspending, thereby suppressing the output voltage fluctuations in each phase of the inverter upon restarting, so as to suppress fluctuations of the voltage supplied to the load.

Yet another object of the present invention is to reduce a delay in supplying the DC power to the load, upon resuming the DC output from the DC power supply device.

Means to Solve the Problem

The present invention relates to a DC power supply device for suspending and resuming the DC output, upon supplying the DC power to a load such as a plasma generator, and a method for controlling the DC power supply device.

In the case where the DC power is supplied assuming the plasma generator as the load, when arc discharge occurs in the plasma generator being the load, supplying of the DC power from the DC power supply device to the plasma generator is suspended, thereby reducing damage to electrodes and substrates. Furthermore, at the time of the arc discharge extinction, supplying of the DC power from the DC power supply device to the plasma generator is resumed.

According to the present invention, upon suspending or resuming the DC output from the DC power supply device, the current flowing in a chopper is held as circulating current, and upon restarting an inverter, the circulating current being held is supplied to the load, thereby reducing delay in supplying the DC power to the load, upon resuming the DC output from the DC power supply device.

In addition, a phase state of a gate signal upon suspending is held, and upon restarting the inverter, DC-AC conversion by the inverter is started based on the phase state of the gate signal being held, thereby suppressing output voltage fluctuations upon restarting.

[DC Power Supply Device]

The DC power supply device according to the present invention is provided with a current source chopper for forming a direct current source, a multiphase inverter for converting a DC output from the current source chopper into multiphase AC power by operations of multiple switching elements, a rectifier for subjecting the output from the multiphase inverter to AC-DC conversion to supply direct current to a load, and a controller for controlling the current source chopper and the multiphase inverter.

In a normal power supplying operation, the current source chopper converts voltage of DC power to a predetermined voltage, and then outputs DC electricity. The multiphase inverter switches current paths according to the operations of the multiple switching elements, thereby converting the DC output from the current source chopper into the multiphase AC power. The rectifier further converts the AC power converted in the multiphase inverter into DC power according to AC-DC conversion, and supplies the DC power thus converted to the load.

In the operating state for supplying the DC power to the load, when arc discharge occurs in the plasma generator assumed as the load, the load voltage is lowered, and simultaneously excess current flows from the power side to the load. The DC power supply device of the present invention suspends the power supply from the power side to the load when the arc discharge occurs, and thereafter, upon extinction of arc discharge, the power supply from the power side to the load is resumed.

It is determined whether or not the arc is extinguished, by detecting voltage such as load voltage. Alternatively, it is possible to preset a time period from the occurrence of arc discharge until the extinction thereof and determine that the arc is extinguished after the lapse of this preset time.

The DC power supply device of the present invention has the functions (a) to (c) as described in the following, and upon suspending and resuming the power supply, allows the phase of the pulse control signal upon restarting the inverter to synchronize with the phase of the pulse control signal upon suspending. With the synchronization of the pulse control signals, the output voltage fluctuations in each phase of the inverter upon restarting are suppressed, thereby further suppressing the fluctuations of the voltage to be supplied to the load.

In addition, upon suspending and resuming the DC output from the DC power supply device, the current flowing in the chopper is held as circulating current upon suspending, and this circulating current is supplied to the load upon restarting the inverter, thereby reducing the delay in supplying the DC power to the load, upon resuming the DC output from the DC power supply device.

(a) Suspend function of the current source chopper and short-circuit function of the inverter:

At the time when the power supply from the power side to the load is suspended, the operation of the current source chopper is stopped, and simultaneously a short-circuit is established between the positive terminal side and the negative terminal side on the input side of the inverter, thereby suspending the current proceeding to the transformer side from the inverter.

(b) Function for holding circulating current of the current source chopper:

While the power supply from the power side to the load is under suspension, the current flowing in the inductor of the current source chopper upon suspending is held as the circulating current, and upon resuming the power supply, the circulating current is made to flow in the inverter, thereby allowing the inverter to restart immediately.

(c) Function for holding the gate signal state of the inverter:

While the power supply from the power side to the load is under suspension, the gate signal state for controlling the inverter upon suspending is held, and in resuming the power supply, the control of the inverter is restarted based on the gate signal state being held.

According to the suspend function of the current source chopper and short-circuit function of the inverter (a) as described above, the power supply to the load is suspended upon occurrence of arc discharge, and according to the function for holding circulating current of the current source chopper (b) and the function for holding the gate signal state of the inverter (c), the inverter is allowed to restart immediately.

The DC power supply device of the present invention has a configuration provided with an arc detector for detecting the arc state of an arc generator, in the case where the arc generator is assumed as the load, and a controller is allowed to perform control to suspend and resume the DC power based on a detection signal of the arc detector. The controller performs the suspend control based on detection of arc occurrence, and performs the resume control based on detection of the arc extinction.

The arc detector detects voltage of the load, or the voltage of the output terminal of the DC power supply device, compares thus detected voltage with a first threshold being predetermined, and detects the arc occurrence when the detected voltage becomes lower than the first threshold.

After detecting the arc occurrence, the detected voltage is compared with a second threshold being predetermined, and when the detected voltage exceeds the second threshold, it is determined that the arc is extinguished.

[Control Method for the DC Power Supply Device]

The controller in the DC power supply device of the present invention has functions to perform the control described below, upon suspending the DC output, during the time under suspension, and upon resuming the DC output, from the DC power supply device.

(Upon Suspending DC Output from the DC Power Supply Device)

In the control for suspending the DC output from the DC power supply device, a main switch of the current source chopper is switched from ON state to OFF state, to stop generation of the gate signal in the bridge circuit constituting the multiphase inverter, simultaneously with establishing a short-circuit between the positive terminal and the negative terminal in the bridge circuit.

In the state where the DC output is being supplied to the load, the current source chopper in the DC power supply device converts the DC power of the DC source to predetermined voltage and inputs the converted voltage to the multiphase inverter. The multiphase inverter converts the DC power to AC power. The rectifier subjects the output from the multiphase inverter to the AC-DC conversion, and supplies the DC power to the load.

Upon suspending the DC output from the DC power supply device, the main switch of the current source chopper is switched from ON state to OFF state, thereby suspending the power supply from the DC source. Upon suspending, when the short-circuit is established between the positive terminal and the negative terminal in the bridge circuit in the multiphase inverter, a closed circuit is formed between the current source chopper circuit and the multiphase inverter. In the closed circuit, energy accumulated in the inductor of the current source chopper while being suspended, flows in the form of circulating current. When the inverter is restarted and the DC output is resumed, this circulating current flows into the circuit on the load side when viewed from the current source chopper, at the point of time prior to supplying the DC output from the DC source, thereby enabling immediate power supply from the inverter to the load.

(During the Time Under Suspension of the DC Output from the DC Power Supply Device)

As the control during the time under suspension of the DC output from the DC power supply device, the OFF state of the main switch of the current source chopper and the short-circuit state between the positive terminal and the negative terminal in the bridge circuit are held, simultaneously with keeping the same gate signal state in the bridge circuit as it was upon suspending.

During the time under suspension of the DC output from the DC power supply device, the OFF state of the main switch of the current source chopper is held, thereby keeping the power supply from the DC source to be suspended, and the short-circuit state between the positive terminal and the negative terminal in the bridge circuit is held, thereby keeping the circulating current to flow in the closed circuit which is formed between the current source chopper circuit and the multiphase inverter. In addition, the gate signal state in the bridge circuit is kept to be the same as it was upon suspending, whereby when the inverter is restarted to resume the DC output from the DC source, it is possible to resume the DC output, keeping the phase state of the pulse control signal in the bridge circuit continuously from the phase state as it was upon suspending.

(Upon Resuming DC Power from the DC Power Supply Device)

As the control of the DC output from the DC power supply device upon resuming, the main switch of the current source chopper is switched from OFF state to ON state, generation of the gate signal in the bridge circuit is resumed in the same gate signal state as it was upon suspending, and the multiphase inverter is restarted by thus generated gate signal.

Upon resuming the DC output from the DC power supply device, the main switch of the current source chopper is switched from OFF state to ON state, thereby resuming conversion of the DC power of the DC source to the predetermined voltage, and thus converted DC power is inputted in the multiphase inverter. On this occasion, ON/OFF operation control is performed by the gate signal whose generation is resumed, and the bridge circuit of the multiphase inverter is restarted. At this timing, generation of the gate signal in the bridge circuit is resumed in the same gate signal state as it was upon suspending, and therefore it is possible to keep the phase state of the pulse control signal in the bridge circuit continuously from the phase state as it was upon suspending.

(Aspects of the Short-circuit Control)

The controller performs the short-circuit control between the positive terminal and the negative terminal in the bridge circuit upon suspending and during the time under suspension of the DC output from the DC power supply device. There are two aspects for performing this short-circuit control.

In the first aspect, a pulse control signal is outputted as the gate signal to each of the switching elements on the negative terminal arms in the bridge circuit, the pulse control signal turning all the switching elements to ON state, as to all the arms on the negative terminal in the bridge circuit.

In the switching operation in the bridge circuit of the multiphase inverter, any of the multiple arms connected to the positive terminal is in the ON state. Therefore, when the pulse control signal is outputted as the gate signal, the signal turning all the switching elements to ON state as to all the arms on the negative terminal in the bridge circuit, a short circuit is established between the positive terminal and the negative terminal in the bridge circuit.

In the second aspect, with regard to a pair of arms respectively on the positive terminal and on the negative terminal in the bridge circuit, a gate signal in the state as it was on the positive terminal upon suspending is outputted to the positive terminal arm in the bridge circuit, and if the switching element on the positive terminal arm in the bridge circuit was in the ON state upon suspending, a gate signal is outputted to the switching element on the negative terminal arm for turning the switching element to ON state, the switching element being the counterpart of the switching element on the positive terminal arm.

Accordingly, in the same switching state as it was upon suspending, the switching element on the positive terminal side arm being in the ON state, and the switching element on the negative terminal side arm, being the counterpart of the switching element on the positive terminal side arm in the bridge circuit, are both turned to ON state, thereby establishing short-circuit between the positive terminal and the negative terminal in the bridge circuit.

(Aspects of Control Upon Resuming)

There are two aspects for the controller to control the switching elements in the bridge circuit, upon resuming the DC output from the DC power supply device.

In the first aspect which is associated with the first aspect of the short-circuit control, the gate signal is stopped which turns all the switching elements on the negative terminal arms in the bridge circuit to ON state, and generation of the gate signal of each switching element is resumed based on the gate signal state as it was upon suspending. The gate signals are inputted into the switching elements of the arms on the positive terminal and the negative terminal in the bridge circuit, and then, the multiphase inverter is restarted.

In the second aspect which is associated with the second aspect of the short-circuit control, generation of the gate signal of each switching element is resumed based on the gate signal state at it was upon suspending. The gate signals are inputted into the switching elements of the arms on the positive terminal and the negative terminal in the bridge circuit, and then, the multiphase inverter is restarted.

EFFECT OF THE INVENTION

As discussed above, according to the present invention, it is possible in restarting the inverter, to synchronize the phase of the pulse control signal upon restarting, with the phase of the pulse control signal upon suspending, in the DC power supply device provided with the inverter.

In addition, according to the present invention, the phase of the pulse control signal upon restarting is synchronized with the phase of the pulse control signal upon suspending, thereby suppressing output voltage fluctuations in each of the phases in the inverter upon restarting, and further suppressing fluctuations in the voltage to be supplied to the load.

It is further possible to reduce a delay in supplying the DC power to the load, upon resuming the DC output from the DC power supply device.

BRIEF DESCRIPTION OF DRAWINGS

FIG. 4 is a timing chart for explaining an operation example of the DC power supply device according to the present invention;

BEST MODE FOR CARRYING OUT THE INVENTION

Figure 1:
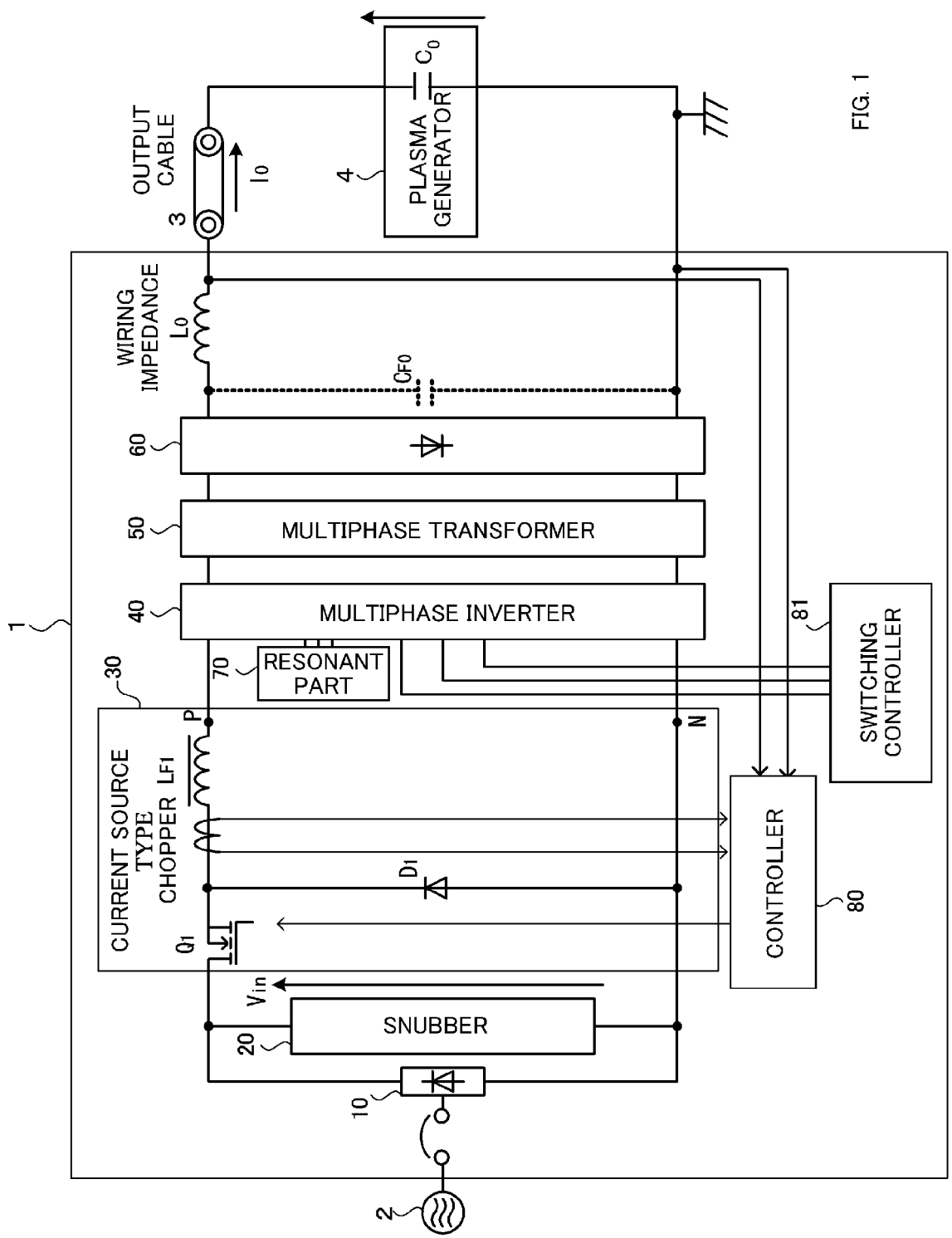
FIG. 1 illustrates a configuration example of the DC power supply device according to the present invention.
Figure 2:
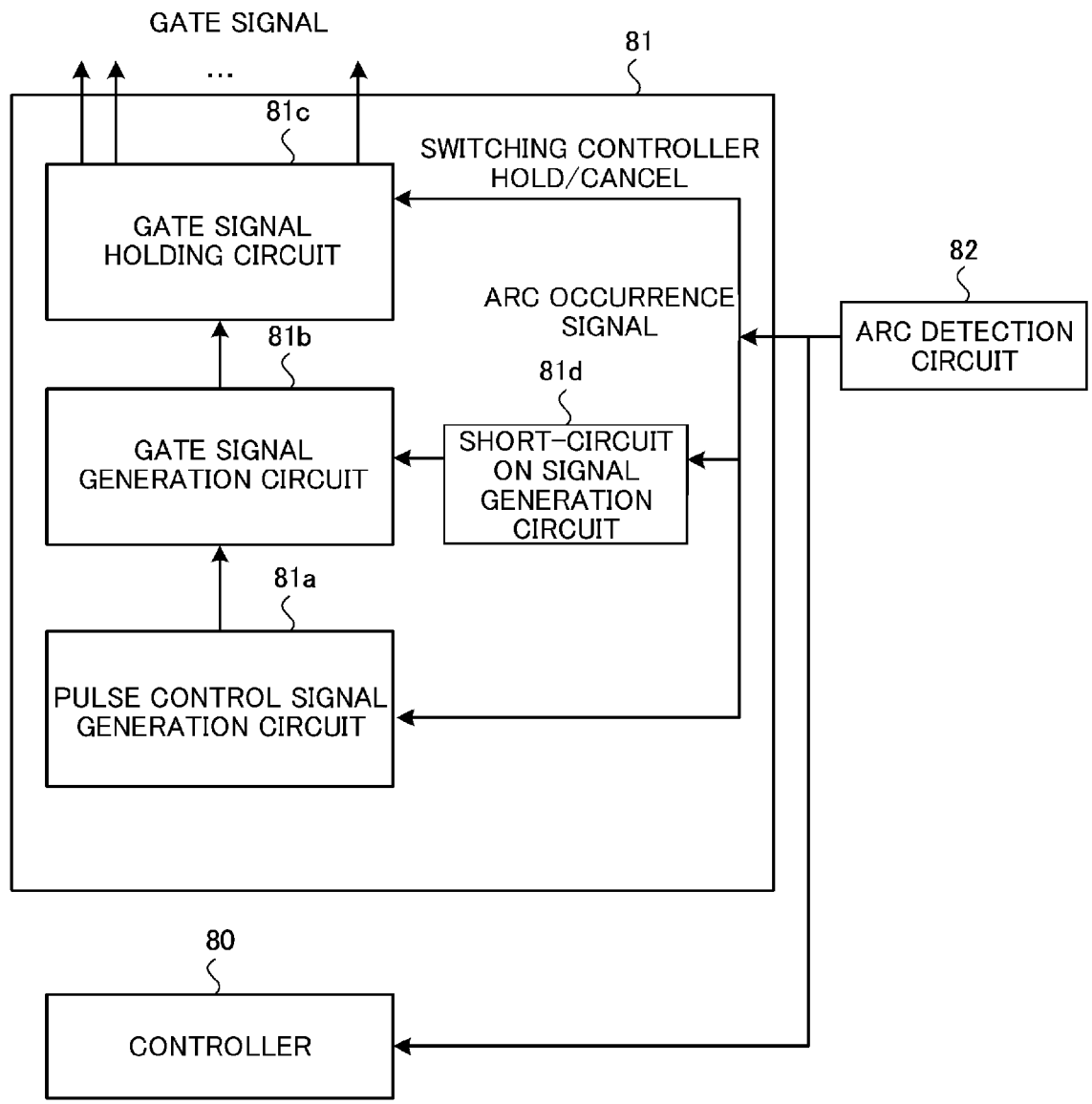
FIG. 2 is a schematic block diagram for explaining one configuration example of the switching controller according to the present invention.

Hereinafter, embodiments of the present invention will be explained in detail with reference to the accompanying drawings. An explanation will be made as to a DC power supply device and a control method thereof according to the present invention as described below. With reference to FIG. 1 and FIG. 2, a configuration example of the DC power supply device will be explained, and a control example of the DC power supply device will be explained with reference to FIG. 3 to FIG. 6.

[Configuration Example of the DC Power Supply Device]

Firstly, with reference to FIG. 1 and FIG. 2, an explanation will be made as to a configuration example of the DC power supply device according to the present invention.

The DC power supply device 1 of the present invention as shown in FIG. 1, is provided with a rectifier 10 for rectifying AC power of an AC source 2, a snubber 20 constituting a protection circuit which suppresses high voltage generated transiently, a current source chopper 30 for converting voltage of DC power inputted from the rectifier 10 into predetermined voltage and outputting DC power, a multiphase inverter 40 for converting the DC output from the current source chopper 30 into multiphase AC output, a multiphase transformer 50 for converting the AC output from the multiphase inverter 40 into predetermined voltage, and a multiphase rectifier 60 for converting the alternate current from the multiphase transformer 50 into direct current.

In the configuration as shown in FIG. 1, an example of a current source step-down type chopper circuit is illustrated as the current source chopper 30. However, it is not restricted to the current source step-down type chopper circuit, but a current source step-up type chopper or a current source step-down and step-up type chopper may be employed.

In the following, an explanation will be made as to the case where a current source step-down type chopper circuit is employed as the current source chopper. The current source chopper 30 is provided with a switching element $Q_1$, a diode $D_1$, and a DC reactor $L_{F1}$. The switching element $Q_1$ performs chopper control on the DC voltage having been rectified by the rectifier 10, thereby accomplishing step-down of voltage. The DC reactor $L_{F1}$ subjects the direct current after the chopper control to current smoothing. The multiphase inverter 40 inputs the direct current being smoothed by the current source chopper 30, and controls the switching elements in the bridge circuit provided in the multiphase inverter 40, thereby performing DC-AC conversion.

The current source chopper 30 may have a configuration that an output capacitor $C_{F1}$ (not illustrated) is connected in parallel to the output terminal. In general, the current source step-down type chopper is not provided with the output capacitor. However, the current source step-down type chopper circuit used as the current source chopper 30 of the present invention has the configuration that the output capacitor $C_{F1}$ is connected to the output terminal, and the output capacitor absorbs, surge voltage that is generated when the switching elements in the multiphase inverter 40 perform commutation operation, and energy of the inductance connected in series with each of the switching elements, thereby achieving protection of the switching elements.

It is to be noted that a value of the output capacitor $C_{F1}$ is defined in such a manner that with a time constant of this output capacitor and wiring inductance, a delay of the current does not have an impact on the commutation of the inverter operation.

The multiphase inverter 40 is provided with a multiphase inverter circuit which is made up of a bridge connection of switching elements, the number of which is associated with the number of phases. By way of example, in the case of three phases, the three-phase inverter circuit is made up of six switching elements. As the switching element, for instance, a semiconductor switching element such as IGBT and MOSFET may be employed. Each switching element of the multiphase inverter circuit performs switching operation based on a control signal from the switching controller 81, and converts DC power into AC power to output the AC power.

The multiphase rectifier 60 rectifies the AC output of the multiphase inverter 40 and supplies DC output to the load. A conventionally known multiphase rectifier may have a configuration that it is provided with a DC filter circuit on the output part. This DC filter circuit removes a high-frequency ripple component included in the AC output from the multiphase inverter. The DC filter circuit may be made up of an output capacitor $C_{FO}$ connected in parallel to the output terminal, and an output reactor $L_{FO}$ (not illustrated) connected in series therewith.

The DC output of the multiphase rectifier 60 is outputted via the wiring inductance $L_O$ provided in the wiring 90, and supplied to the plasma generator 4 via the output cable 3 that establishes connection between the DC power supply device 1 and the plasma generator 4.

The DC power supply device 1 of the present invention may be configured in such a manner that the multiphase rectifier 60 is allowed to use parasitic impedance instead of the DC filter circuit, so as to remove a high-frequency ripple component. By way of example, it is possible to use as an inductance component, the inductance $L_0$ held by the wiring impedance 90 between the multiphase rectifier 60 and the output terminal, inductance or capacitor included in the output cable 3 connected between the DC power supply device 1 and the load, or electrode capacitance $C_0$ in the plasma generator 4 for the case of plasma load. The aforementioned parasitic impedance of the multiphase inverter, and capacitive components in the output cable and the electrode capacitance substantially constitute the DC filter circuit, thereby reducing the high-frequency ripple component.

In addition, the ripple component of the DC voltage possesses a property to increase, when the drive frequency of the multiphase inverter circuit is decreased. Therefore, by increasing the drive frequency of the multiphase inverter circuit, it is possible to reduce the necessity of the output capacitor $C_{FO}$ and the output reactor $L_{FO}$. Furthermore, increase of the drive frequency of the multiphase inverter circuit may cause suppression on the energy held inside the DC power supply device 1.

The DC power supply device 1 of the present invention is further provided with a controller 80 for controlling the current source chopper 30, and the switching controller 81 for controlling the multiphase inverter 40.

The controller 80 is a circuit for performing chopper control on the switching element $Q_1$ of the current source chopper 30, and the controller 80 detects chopper current being the output current of the switching element $Q_1$ and output voltage of the DC power supply device 1, and controls the output from the current source chopper 30 to become a predetermined current value and a predetermined voltage value.

The switching controller 81 controls the switching operations of the switching elements connected respectively to the arms constituting the bridge circuit of the multiphase inverter 40. The multiphase inverter 40 controls the switching elements to subject the inputted DC to the DC-AC conversion so as to obtain AC.

The multiphase inverter 40 is made up of the bridge circuit having six arms as shown in FIG. 5 and FIG. 6, for instance, if it is a three-phase inverter. Those arms are respectively provided with six switching elements $Q_R$, $Q_S$, $Q_T$, $Q_X$, $Q_Y$, and $Q_Z$. The switching element $Q_R$ and the switching element $Q_X$ are connected in series, the switching element $Q_S$ and the switching element $Q_Y$ are connected in series, and the switching element $Q_T$ and the switching element $Q_Z$ are connected in series.

The connection point R between the switching element $Q_R$ and the switching element $Q_X$ is connected as an R-phase component of the three-phase transformer 51 via the inductance $L_{m1}$, the connection point S between the switching element $Q_S$ and the switching element $Q_Y$ is connected as an S-phase component of the three-phase transformer 51 via the inductance $L_{m2}$, and the connection point T between the switching element $Q_T$ and the switching element $Q_Z$ is connected as a T-phase component of the three-phase transformer 51 via the inductance $L_{m3}$. It is to be noted that FIG. 5 and FIG. 6 are illustrated without the inductances $L_{m1}$, $L_{m2}$, and $L_{m3}$.

For controlling the current source inverter, PWM control is known, which is able to change the magnitude of output current under a certain input current. The PWM control compares a carrier wave with a modulation wave, thereby forming a pulse control signal as to each phase. In the case of the three-phase inverter, the pulse control signal of each phase has on-period of 120°. This pulse control signal performs ON/OFF control of the switching elements of respective arms of the inverter, thereby forming R-phase current, S-phase current, and T-phase current, having 120° phase difference therebetween.

The controller 80 and the switching controller 81 receive a feedback signal from the output terminal of the DC power supply device 1 or the load side. The feedback signal may be voltage of the output terminal of the DC power supply device 1, for instance.

Next, with reference to FIG. 2, an explanation will be made as to one configuration example of the switching controller 81. FIG. 2 is a schematic block diagram for explaining one configuration example of the switching controller.

The switching controller 81 is provided with a pulse control signal generation circuit 81a for generating a pulse control signal to perform ON/OFF control of the switching elements of the multiphase inverter, a short-circuit ON signal generation circuit 81d for generating a short-circuit ON signal to establish a short-circuit between the positive terminal and the negative terminal in the bridge circuit, a gate signal generation circuit 81b for generating a gate signal from the pulse control signal generated by the pulse control signal generation circuit 81a and the short-circuit ON signal generated by the short-circuit ON signal generation circuit 81d, and a gate signal holding circuit 81c for holding the gate signal generated by the gate signal generation circuit 81b and outputting the gate signal.

The gate signal generation circuit 81b generates a gate signal based on the pulse control signal generated by the pulse control signal generation circuit 81a, and the short-circuit ON signal generated by the short-circuit ON signal generation circuit 81d.

The gate signal holding circuit 81c is a circuit for holding and outputting the gate signal generated by the gate signal generation circuit 81b, and performs a holding operation or a canceling operation for canceling the holding operation, according to the arc occurrence signal described below. The gate signal inputted from the gate signal generation circuit 81b is held by the holding operation, and the gate signal in the holding state is outputted. On the other hand, in the canceling operation, the holding operation is canceled, and the gate signal inputted from the gate signal generation circuit 81b is outputted.

The switching controller 81 inputs the arc occurrence signal detected by the arc detection circuit 82. The arc detection circuit 82 detects a developmental state of the arc discharge in the arc generator being the load, based on the voltage on the load or on the output terminal, for instance.

For detecting the arc state, the arc detection circuit 82 compares voltage of the load or voltage of the output terminal of the DC power supply device with a first threshold, for example, and when the detected voltage becomes lower than the first threshold, it is detected that the arc discharge has occurred. In addition, after the occurrence of the arc discharge is detected, the detected voltage is compared with a predetermined second threshold, and when the detected voltage exceeds the second threshold, it is determined that the arc is extinguished.

Upon detecting the occurrence of arc discharge, the arc detection circuit 82 temporarily stops each generating operation of the pulse control signal generation circuit 81a, along with maintaining the signal status thereof.

When it is determined that the arc is extinguished after detecting the occurrence of the arc discharge, the arc detection circuit 82 cancels the holding state of the pulse control signal generation circuit 81a and resumes the generating operation. The pulse control signal generation circuit 81a resumes generation of each signal in the same signal state as it was when the arc discharge occurred.

The arc detection circuit 82 inputs an arc occurrence signal into the aforementioned pulse control signal generation circuit 81a, and further inputs arc occurrence signals in the gate signal holding circuit 81c and the short-circuit ON signal generation circuit 81d.

The gate signal holding circuit 81c receives the arc occurrence signal, and when the occurrence of arc discharge is detected, the gate signal holding circuit holds a gate signal at that point of time, and simultaneously outputs the gate signal at the hold timing. When it is determined that the arc is extinguished according to the arc occurrence signal after detecting the arc discharge occurrence, the gate signal holding circuit 81c cancels the holding state of the gate signal, and outputs the gate signal generated by the gate signal generation circuit 81b.

The gate signal holding circuit 81c counts the time elapsed from the time when the occurrence of arc discharge was detected, and it is determined that the arc is extinguished after a lapse of a predetermined holding time $t_{arc}$. Then, the gate signal holding circuit may cancel the holding state of the gate signal, and output a gate signal generated in the gate signal generation circuit 81b. The holding time $t_{arc}$ corresponds to a period to hold the state where DC current assumed as circulating current $\Delta i$ is made to flow, the DC current being the same as the current immediately before the occurrence of the arc discharge. Any time period may be set as the holding time $t_{arc}$, and for instance, it may be defined by obtaining in advance a time which is required as the time from the occurrence of the arc discharge to the extinction thereof, with regard to the load as the control target, and adding to thus obtained time, a margin being predicted from a fluctuating range, or the like.

With the arc discharge generation signal being inputted, the short-circuit ON signal generation circuit 81d generates a short-circuit ON signal to establish a short-circuit between the positive terminal and the negative terminal of the multiphase inverter. The short-circuit ON signal switches to be ON state, both the switching element provided on the arm on the positive terminal side and the switching element provided on the arm on the negative terminal side of the multiphase inverter, thereby establishing a short-circuit between the positive terminal and the negative terminal of the multiphase inverter.

There are two aspects for this short-circuit ON signal.

The first aspect relates to the switching element on the arm of the negative terminal in the bridge circuit, and all the switching elements of all the arms of the negative terminal in the bridge circuit are turned to ON state, thereby establishing a short-circuit between the positive terminal and the negative terminal of the multiphase inverter.

In the switching operation of the bridge circuit in the multiphase inverter, any of the multiple arms connected to the positive terminal are in ON state. A pulse control signal is outputted as a gate signal, for turning all the switching elements on all the arms of the negative terminal in the bridge circuit to be ON state, thereby establishing a short-circuit between the positive terminal and the negative terminal in the bridge circuit.

The first short-circuit ON signal is a pulse control signal which turns all the switching elements on all the arms of the negative terminal in the bridge circuit to ON state. In the gate signal generation circuit 81b, a normal pulse control signal generated in the pulse control signal generation circuit 81a, and the short-circuit ON signal generated in the short-circuit ON signal generation circuit 81d are added under OR condition, thereby generating a gate signal.

The second aspect relates to a pair of arms respectively of the positive terminal and the negative terminal in the bridge circuit, a gate signal on the positive terminal in the same gate signal state as it was upon suspending is outputted, and detects a switching element on the arm of the negative terminal, being the counterpart of the switching element on the arm of the positive terminal in the bridge circuit being in ON state upon suspending, and turns this switching element on the arm of the negative terminal to ON state, thereby establishing a short-circuit between the positive terminal and the negative terminal of the multiphase inverter.

Accordingly, the switching element on the arm of the positive side being in the same state as it was upon suspending, and the switching element on the negative terminal side being the counterpart of this positive side switching element in the bridge circuit, are both turned to ON state, thereby establishing a short-circuit between the positive terminal and the negative terminal in the bridge circuit.

The second short-circuit ON signal is a pulse control signal which turns the switching element on the arm of the negative side to ON state, being the counterpart of the ON-state switching element on the arm of the positive terminal side in the bridge circuit.

In the gate signal generation circuit 81b, the normal pulse control signal generated in the pulse control signal generation circuit 81a, and the short-circuit ON signal generated in the short-circuit ON signal generation circuit 81d are added, thereby generating a gate signal.

[Operation Example of DC Power Supply Device]

Figure 3:
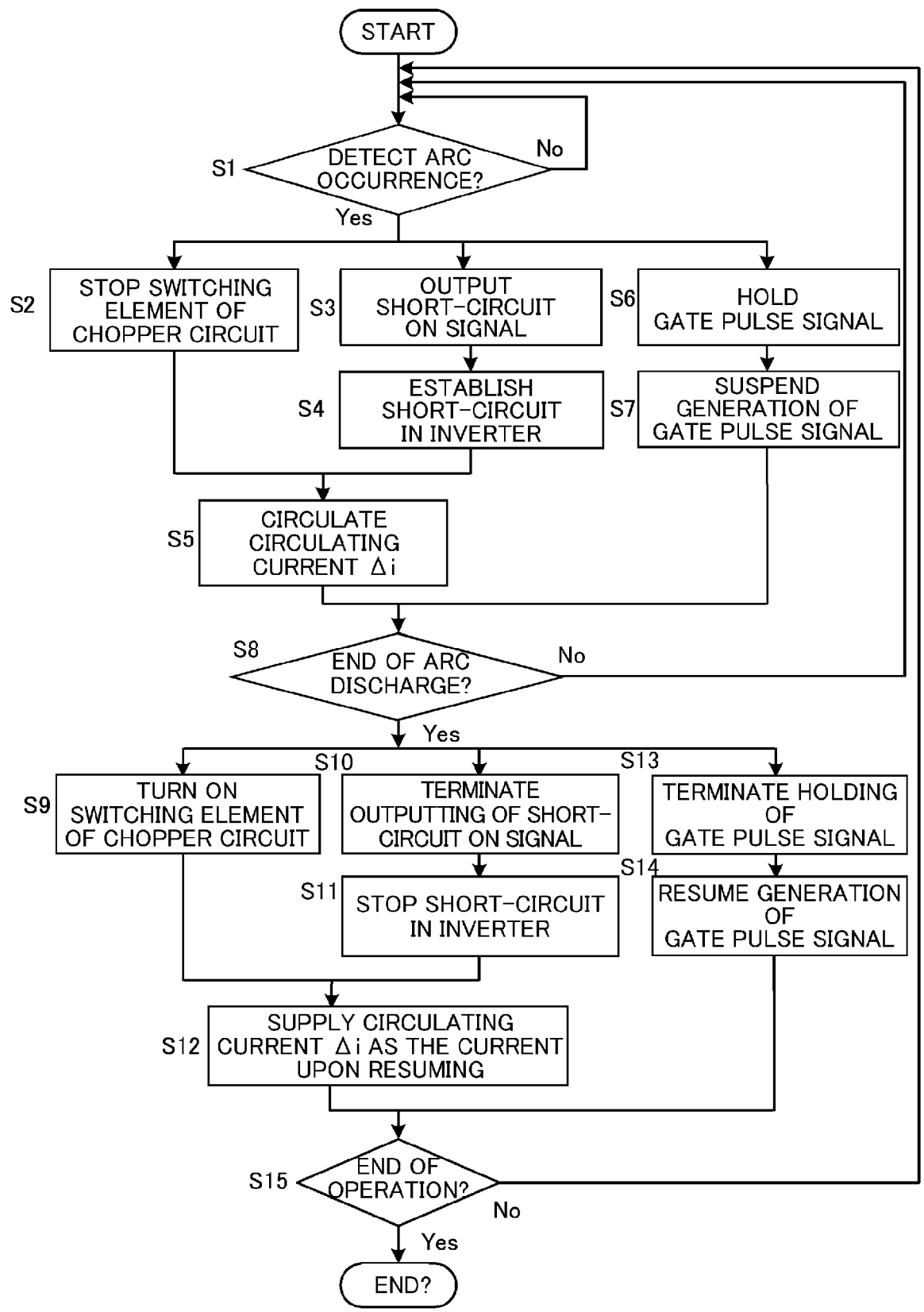
FIG. 3 is a flowchart for explaining an operation example of the DC power supply device according to the present invention.

Next, with reference to FIG. 3 to FIG. 6, an operation example of the DC power supply device according to the present invention will be explained. FIG. 3 is a flowchart for explaining the operation example of the DC power supply device according to the present invention, FIG. 4 is a timing chart for explaining the operation example of the DC power supply device according to the present invention, FIG. 5 illustrates a flow of current upon occurrence of the arc discharge in the DC power supply device according to the present invention, and FIG. 6 illustrates a flow of current at the time of extinction of the arc discharge in the DC power supply device according to the present invention.

The flowchart of FIG. 3 shows the operation example when the arc discharge occurs (S1 to S7) and operation example when the arc is extinguished (S8 to S15), in the state where the DC power supply device performs normal operations.

In the state where the DC power supply device supplies DC power to the load, when the arc discharge occurs in the arc generator being the load, the input voltage into the load or the output voltage from the DC power supply device is lowered.

The arc detector detects and monitors the voltage of the load or on the output terminal of the DC power supply device, and when the voltage is lowered, it is detected that the arc discharge has occurred. Detection of the arc discharge occurrence can be carried out by comparing the detected value with a predetermined threshold. It is to be noted that this detection of arc discharge is not limited to the comparison between the detected value of voltage and the threshold (S1).

(Operation Example Upon Occurrence of the Arc Discharge)

When the arc discharge occurrence is detected, the switching element of the chopper circuit is stopped (S2), and the short-circuit ON signal generated by the short-circuit ON signal generation circuit 81*d* (S3) establishes a short-circuit between the positive terminal and negative terminal of the multiphase inverter (S4).

According to the step of S2, the power supply from the DC source to the chopper circuit is stopped, further stopping the DC power from the DC power supply device to the load, and according to the steps of S3 and S4, a closed circuit is formed between the chopper circuit and the bridge circuit of the multiphase inverter. The current flowing in the inductance of the chopper circuit circulates in the closed circuit being formed, as circulating current $\Delta i$ (S5).

The circulating current $\Delta i$ is supplied to the multiphase inverter, when supplying of the DC power from the DC power supply device to the load is resumed, thereby accelerating a rise-up of DC-AC conversion by the multiphase inverter.

At the time when the DC power supply device is stopped, the gate signal of the multiphase inverter at this stop timing is held (S6), and generation of the gate signal by the gate signal generation circuit is suspended (S7).

According to the step S6 for holding the gate signal, and the step S7 for suspending the generation of a new gate signal, it is possible to maintain a transform state of the DC-AC conversion by the multiphase inverter, at the timing when the DC power supply device was stopped.

(Operation Example Upon Extinction of the Arc Discharge)

When extinction of the arc discharge is detected after detecting the arc discharge occurrence, or after a lapse of time which is assumed as sufficient to extinguish the arc discharge (S8), the switching element of the chopper circuit is turned to ON state (S9) and outputting of the short-circuit ON signal is terminated (S10), thereby halting the short circuit between the positive terminal and the negative terminal of the multiphase inverter (S11).

According to the step of S9, power supply from the DC source to the chopper circuit is resumed, and according to the steps of S10 and S11, the circulating current $\Delta i$ flowing in the closed circuit formed between the chopper circuit and the bridge circuit of the multiphase inverter is supplied to the bridge circuit of the multiphase inverter (S12).

According to the step of S9, when conduction of the chopper circuit is resumed, inductance and floating capacitance held by the chopper circuit may cause a delay in the DC current supplied from the DC source to the multiphase inverter. On the other hand, the short circuit is stopped between the positive terminal and the negative terminal of the multiphase inverter and a current path is formed between the chopper circuit and the multiphase inverter, thereby supplying the circulating current $\Delta i$ to the multiphase inverter prior to the supply of DC current from the DC source, and therefore it is possible to accelerate the restarting of the multiphase inverter.

In addition, at the time of resuming the DC output from the DC power supply device, holding of the gate signal is terminated (S13), and generation of the gate signal is resumed from the phase state being held (S14).

According to the steps of S13 and S14, it is possible to generate the gate signal from the same phase state as it was when the DC power supply device was suspended.

The steps from S1 to S14 are repeated until the operation of the DC power supply device is completed (S15).

The timing chart of FIG. 4 shows an example that a three-phase inverter is used as the multiphase inverter. FIG. 4A indicates the output voltage ($V_O$) from the DC power supply device, FIG. 4B indicates an arc detection signal according to the arc detector, FIG. 4C indicates a drive state of the chopper circuit, FIG. 4D to FIG. 4I indicate gate signals for controlling the drive of the switching elements provided in the respective arms of the three-phase inverter, and FIG. 4J indicates the short-circuit ON signal for establishing a short-circuit between the positive terminal and the negative terminal of the three-phase inverter.

FIG. 4D, F, and H indicate gate signals for driving the switching elements $Q_R$, $Q_S$, and $Q_T$ on the respective arms on the positive terminal side of the three-phase inverter, and FIG. 4E, G, and I indicates gate signals for driving the switching elements $Q_{X1}$, $Q_{Y1}$, and $Q_{Z1}$ on the arms on the negative terminal side of the three-phase inverter. The switching element $Q_R$ pairs up with the switching element $Q_{X1}$, the switching element $Q_S$ pairs up with the switching element $Q_{Y1}$, and the switching element $Q_T$ pairs up with the switching element $Q_{Z1}$. One cycle of the gate signal is represented as twelve frames, respectively labeled 1 to 12 in the figure.

In FIG. 4, when the arc discharge occurs during the frame "1" among the twelve frames, DC current supply from the DC power supply device is suspended, and at the time when arbitrarily settable holding time $t_{arc}$ has elapsed, it is determined that the arc is extinguished, and the inverter is restarted to resume supplying the DC current.

Since the horizontal axis of FIG. 4 indicates a phase, a frame of the holding time $t_{arc}$ is represented by the phase of "$\omega \times t_{arc}$" (FIG. 4A). The holding time $t_{arc}$ represents a time frame for holding the state in which the arc discharge occurred, and it corresponds to a period from the occurrence of the arc discharge to the extinction thereof, and it may be set to any value.

The output voltage $V_O$ is lowered when the arc discharge occurs, and recovers when it is determined that the arc is arc extinguished after a lapse of the phase component of "$\omega \times t_{arc}$". The arc detector monitors the output voltage $V_O$, starts outputting the arc occurrence signal upon detecting the lowering of the output voltage $V_O$, and terminates outputting the arc occurrence signal upon detecting that the output voltage $V_O$ has recovered, or after a lapse of holding time $t_{arc}$ (FIG. 4B).

Upon receipt of an arc occurrence signal, the chopper circuit continues operation until the end of one frame including the time point receiving the arc occurrence signal, among the multiple frames (12 frames in FIG. 4) constituting one cycle, and supplies DC current being an output from the chopper to the three-phase inverter. In the example being illustrated, the arc occurrence signal is received in the middle of the frame "1", and thus the operation of the chopper circuit is stopped at the end point of the frame "1".

In a normal operation, the gate signal generator assumes, as to each phase of the three phase, the signal width as $2\pi/3$, the signal interval as 4π/3, and outputs the gate signals at intervals of 2π/3. For example, the gate signal of the switching element $Q_R$ on the positive terminal side (FIG. 4D) turns the frames 1 to 4 to be ON state, and turns the frames 5 to 12 to be OFF state. As for the gate signal of the switching element $Q_S$ (FIG. 4F), the frames from 5 to 8 are turned to ON state, and the frames from 9 to 12 and the frames from 1 to 4 are turned to OFF state. In addition, as for the gate signal of the switching element $Q_T$ (FIG. 4H), the frames from 9 to 12 are turned to ON state, and the frames from 1 to 8 are turned to OFF state.

Upon receipt of the arc occurrence signal, if the gate signal is in the output state when the gate signal is received, the switching controller holds the output state and maintains outputting of the gate signal. Thereafter, when extinction of the arc discharge is detected or the holding time has elapsed and the arc occurrence signal is terminated, generation of the gate signal is resumed, and gate signals for the remaining frames are generated, the frames being left unhandled after the time of receiving the arc occurrence signal.

Therefore, the frame width obtained by adding the frame width before the time of arc occurrence, to the frame width after the arc discharge extinction or after a lapse of holding time corresponds to the frame width being 2π/3 of the gate signal.

For example, as for the gate signal of the switching element $Q_R$ on the positive terminal side (FIG. 4D), the period corresponding to "ω×t₁" from the initial point of the frame "1" to the point when the arc discharge occurs is turned to ON state, and the ON state is maintained during the period of "ω×t_{arc}" when the arc discharge continues. In addition, the ON state is made to continue only for the period corresponding to "2π/3−ω×t1" being a reminder of 2π/3, from the point when the arc discharge is extinguished or from the point when the holding time elapsed. Accordingly, a total of the frame width "ω×t₁" before the arc occurrence point, and the frame width "2π/3−ω×t₁" after the point of arc discharge extinction or after a lapse of the holding time results in outputting the gate signal being in ON state in the frame width corresponding to 2π/3.

Similar operation control is carried out for the case where the gate signal at the time of arc discharge occurrence is in the OFF state. For example, as for the gate signal of the switching element $Q_S$ on the positive terminal side (FIG. 4F), the total of the frames 9 to 12 and a part of the frame until the arc discharge occurrence, being in the midpoint of the frame "1", corresponds to "π/3+ω×t₁" which is in the OFF state, and the OFF state maintains in the frame of "ω×t_{arc}" where the arc discharge continues. Moreover, the OFF state is made to continue for "2π/3−ω×t₁" being the remainder of the signal frame of 4π/3, from the point of arc discharge extinction or after a lapse of the holding time. Accordingly, a total of the frame width "2π/3+ωt₁" before the arc occurrence point, and the frame width "2π/3−ω×t₁" after the point of arc discharge extinction or after a lapse of the holding time results in outputting the gate signal being in the OFF state having the frame width corresponding to 4π/3.

In addition, during the holding time $t_{arc}$, which is settable to any period between the point of the arc discharge occurrence until the point determined as the arc discharge extinction, the short-circuit ON signal as shown in FIG. 4J is outputted.

FIG. 5 illustrates a circuit state at the point of the arc discharge occurrence. When the arc discharge occurs, the arc detection signal turns the switching element $Q_1$ of the chopper circuit to be OFF state to stop the current supply from the DC source, and simultaneously, establishes a short-circuit in the three-phase inverter by the short-circuit ON signal. Then, the arc detection signal forms a closed circuit between the chopper circuit and the three-phase inverter, along with allowing the circulating current Δi to flow.

Figure 5A:
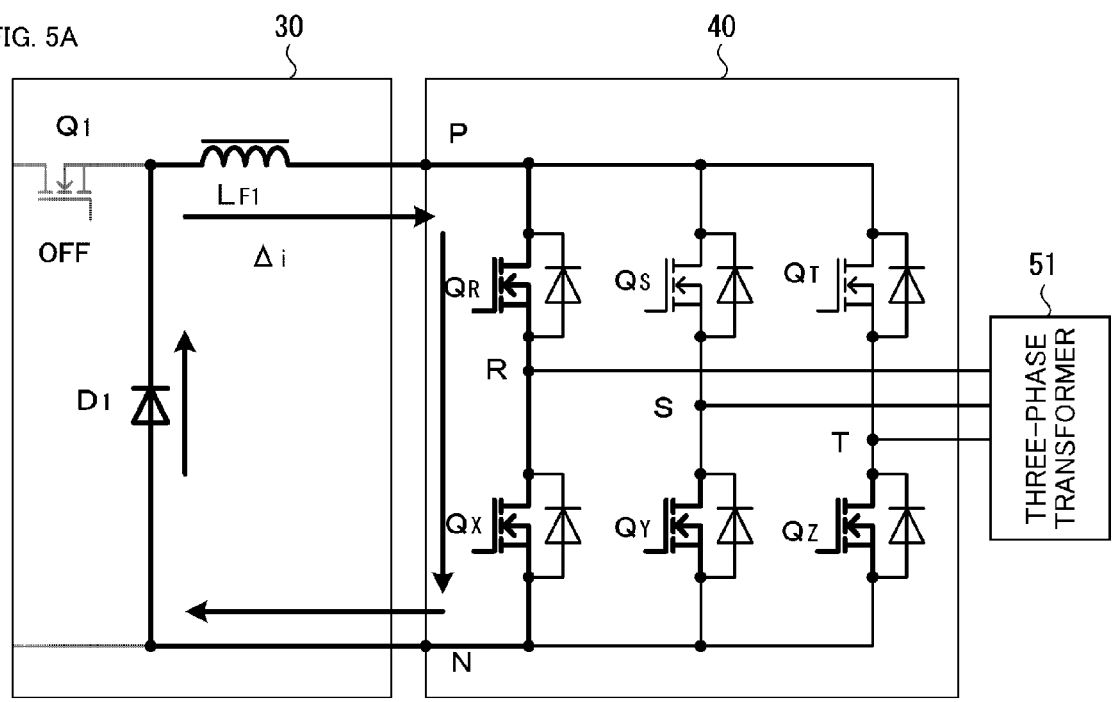
FIG. 5 illustrates a flow of current upon occurrence of arc discharge in the DC power supply device according to the present invention.

FIG. 5A illustrates an example that all the switching elements $Q_X$, $Q_Y$, and $Q_Z$ on the negative terminal side arms of the three-phase inverter are turned to ON state, and the closed circuit is formed by these switching elements and any of the switching element being in the ON state among the switching elements $Q_R$, $Q_S$, and $Q_T$ on the positive terminal side arms. In FIG. 5A, the switching element $Q_R$ on the positive terminal side arm and all of the switching elements $Q_X$, $Q_Y$, and $Q_Z$ on the negative terminal side arms are turned to ON state, and the circulating current flows in the closed circuit formed by those switching elements $Q_R$, $Q_X$, $Q_Y$, and $Q_Z$, the diode $D_1$, and the inductance of $L_{F1}$.

Figure 5B:
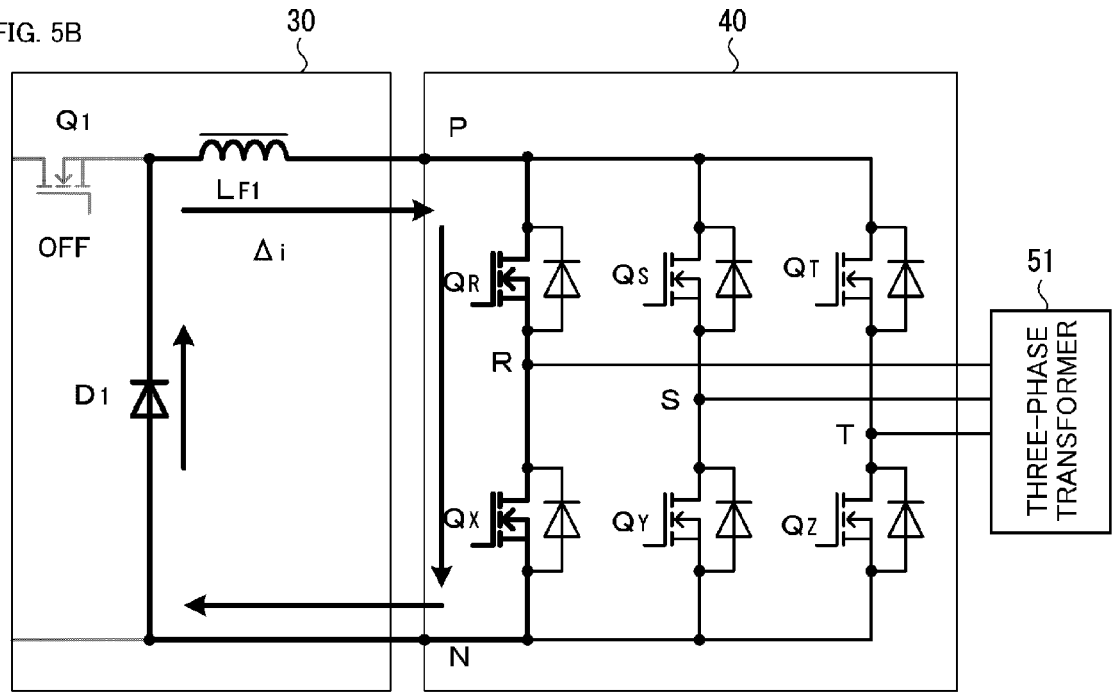

FIG. 5B illustrates an example that a switching element is detected out of the switching elements $Q_X$, $Q_Y$, and $Q_Z$ on the negative terminal side arms of the three-phase inverter, the detected switching element being the counterpart of the switching element in the ON state among the switching elements $Q_R$, $Q_S$, and $Q_T$ on the positive terminal side arms, and the detected switching elements is turned to ON state, thereby forming the closed circuit. FIG. 5B illustrates an example that the switching element $Q_R$ on the positive terminal side arm and the switching element $Q_X$ on the negative terminal side arm being the counterpart of the switching element $Q_R$, are turned to ON state, and the circulating current flows in the closed circuit made up of these switching elements $Q_R$ and $Q_X$, the diode $D_1$, and the DC reactor $L_{F1}$.

FIG. 6 illustrates the circuit state at the time of the arc discharge extinction. Upon the extinction of the arc discharge, the arc detection signal switches the switching element $Q_1$ of the chopper circuit from OFF state to ON state, resumes the current supply from the DC source, and simultaneously stops the short-circuit ON signal, thereby canceling the short-circuited state of the three-phase inverter. The circulating current Δi flowing in the closed circuit between the chopper circuit and the three-phase inverter is supplied to the three-phase inverter side. The three-phase inverter is also supplied with the DC current from the DC source via the switching element $Q_1$, following the circulating current Δi.

Figure 6A:
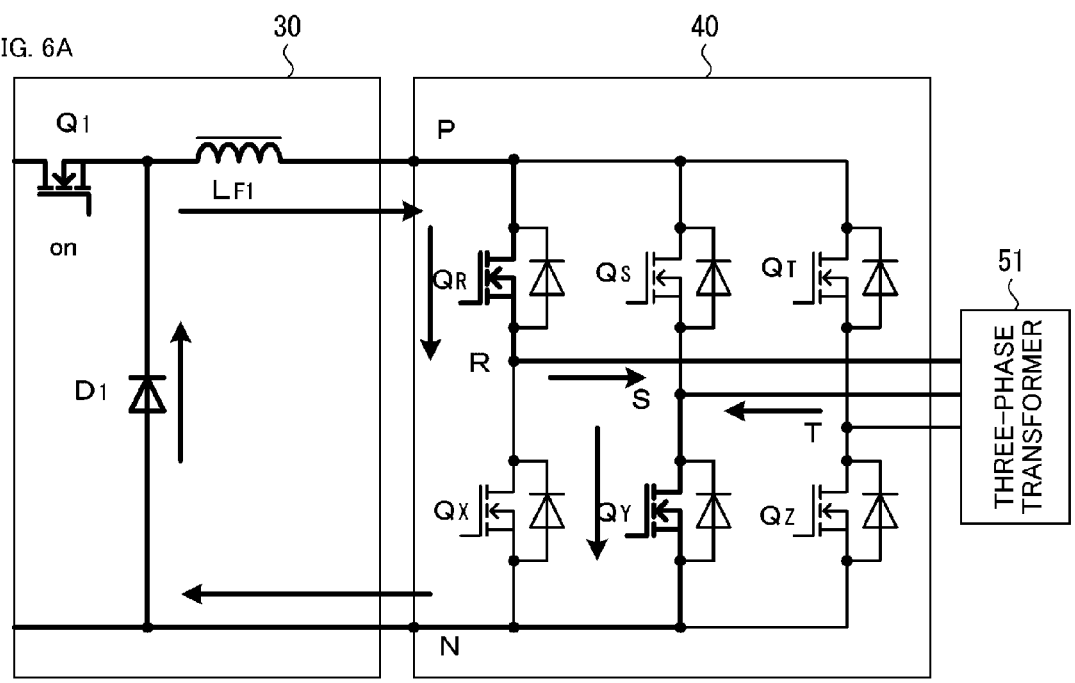
FIG. 6 illustrates a flow of current upon extinction of arc discharge in the DC power supply device according to the present invention.

FIG. 6A illustrates the state where the circulating current Δi flows in the three-phase inverter. In the switching control of the three-phase inverter, if suspending occurred when the switching elements $Q_R$ and the switching element $Q_Y$ were in the ON state, restarting is performed from the state where the switching element $Q_R$ and the switching element $Q_Y$ are in the same ON state as it was upon suspending. According to the restarting of the three-phase inverter, the circulating current Δi flows through the line along the switching element $Q_R$, the connection point R, the three-phase transformer, the connection point S, and the switching element $Q_Y$.

Figure 6B:
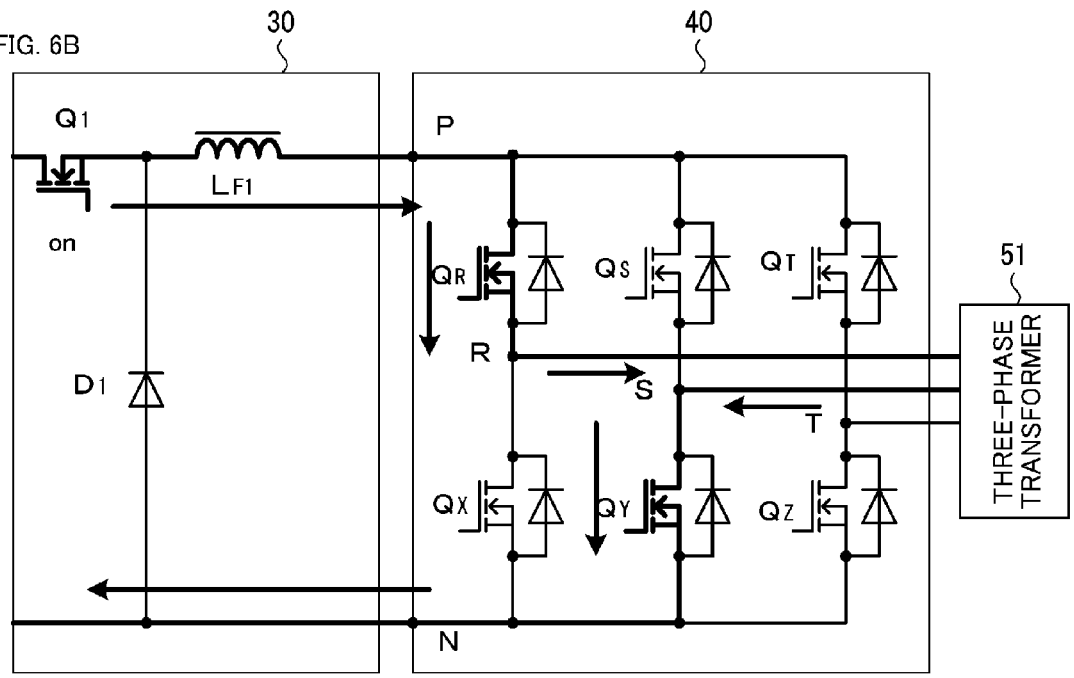

FIG. 6B illustrates the state that after the circulating current Δi flows, the current supplied from the DC source via the switching element $Q_1$ flows in the three-phase inverter. The current from the DC source flows through the line along the switching element $Q_R$, the connection point R, the three-phase transformer, the connection point S, and the switching element $Q_Y$. Hereinafter, similar to the normal operation, the three-phase inverter performs conductive control on the switching elements by the gate signals, and carries out the DC-AC conversion.

Figure 7:
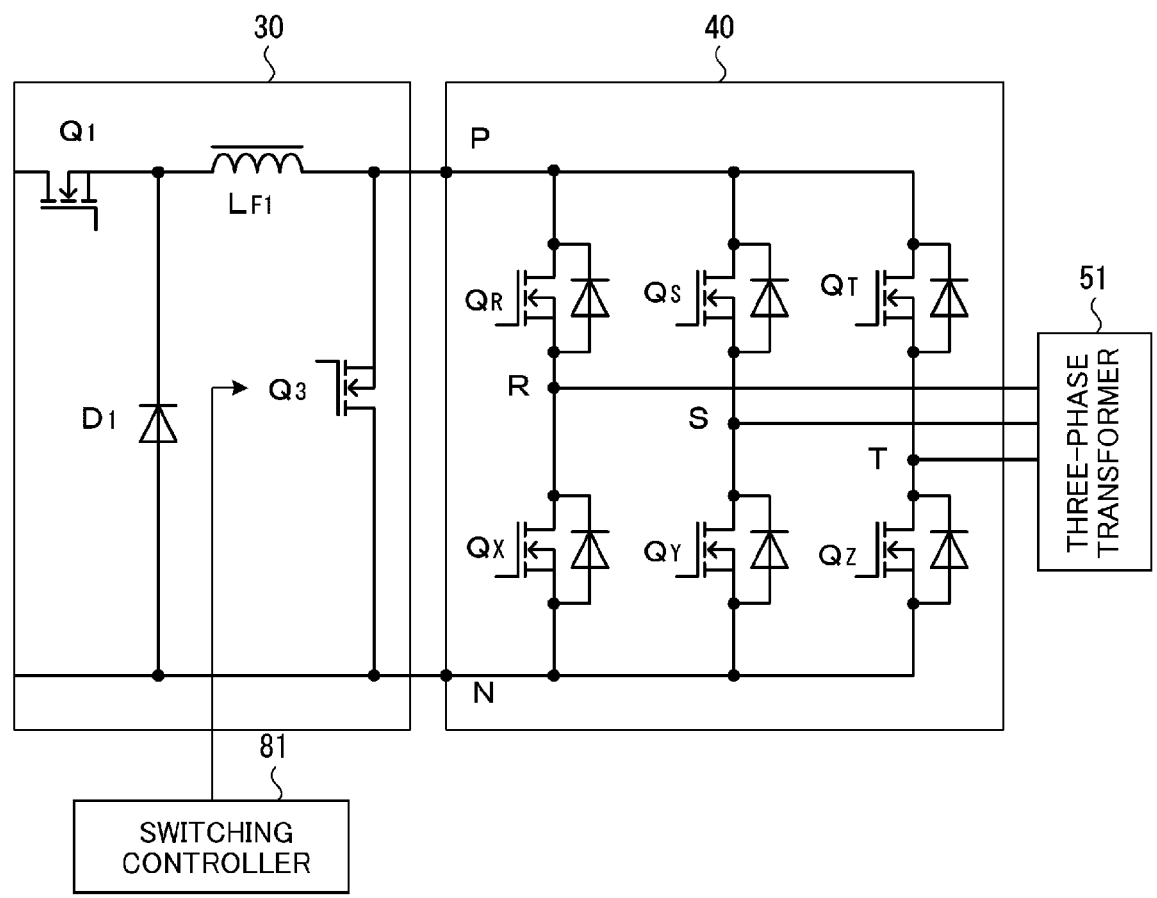
FIG. 7 illustrates another configuration example of the DC power supply device according to the present invention.

FIG. 7 illustrates another configuration example, of the DC power supply device according to the present invention. The aforementioned configuration example illustrates that a short-circuit is established in the three-phase inverter by controlling the ON state of the switching elements in the three-phase inverter. On the other hand, in the configuration example of FIG. 7, instead of the short-circuit in the three-phase inverter, the switching element $Q_3$ is connected in parallel between the chopper circuit and the three-phase inverter. By turning the switching element $Q_3$ to ON state according to the short-circuit ON signal, a short-circuit is established between the output terminals of the chopper circuit, and the circulating current is made to flow within the closed circuit formed in the chopper circuit.

It is to be noted that the embodiments and modifications in the preceding description are intended to illustrate the current source inverter and the control method of the current source inverter relating to the present invention, and the present invention is not restricted to each of the embodiments. It should be understood that the present invention may be variously modified based on the purpose of the invention, and it is intended to cover all such modifications within the scope of the present invention.

INDUSTRIAL APPLICABILITY

The current source inverter of the present invention may be applied as a power source to supply power to a plasma generator.

EXPLANATION OF REFERENCES

1 DC power supply device
2 AC source
3 Output cable
4 Plasma generator
10 Rectifier
20 Snubber
30 Current source chopper
40 Multiphase inverter
50 Multiphase transformer
51 Phase transformer
60 Multiphase rectifier
80 Controller
81 Switching controller
81a Pulse control signal generation circuit
81b Gate signal generation circuit
81c Gate signal holding circuit
81d Short-circuit ON signal generation circuit
82 Arc detection circuit
90 Wiring
$C_0$ Electrode capacitance
$C_{F1}$ Output capacitor
$C_{FO}$ Output capacitor
$D_1$ Diode
$L_0$ Wiring inductance
$L_{F1}$ DC reactor
$L_{FO}$ Output reactor
$L_{m1}$, $L_{m2}$, $L_{m3}$ Inductance
$L_R$ Inductance
$P_C$ Arc Energy
$Q_1$ Switching element
$Q_3$ Switching element
$Q_R$, $Q_S$, $Q_T$ Switching element
$Q_X$, $Q_Y$, $Q_Z$ Switching element
R Connection point
S Connection point
T Connection point
$t_{arc}$ Holding time
$V_O$ Output voltage
$\Delta i$ Circulating current

What is claimed is:

1. A DC power supply device, comprising
a current source chopper forming a direct current source,
a multiphase inverter for converting a DC output from the current source chopper into multiphase AC power by operating multiple switching elements,
a rectifier for subjecting an output from the multiphase inverter to AC-DC conversion to supply direct current being obtained to a load, and
a controller for controlling the current source chopper and the multiphase inverter,
the controller having a control function for performing suspend and resume control of the DC output,
the control function for performing the suspend and resume control comprising the functions of,
suspend control for switching a main switch of the current source chopper from ON state to OFF state, upon suspending the DC output from the DC power supply device, and suspending generation of a gate signal for a bridge circuit constituting the multiphase inverter, simultaneously with establishing a short circuit between a positive terminal and a negative terminal in the bridge circuit,
suspend holding control for holding, under suspension of the DC output from the DC power supply device, the OFF state of the main switch of the current source chopper, and the short circuit state between the positive terminal and the negative terminal in the bridge circuit, and holding a phase of a gate signal state in the bridge circuit to be the same as a phase of the gate signal state upon suspending, and
resume control for switching the main switch of the current source chopper from OFF state to ON state, resuming the generation of the gate signal for the bridge circuit based on the phase of the gate signal state upon suspending, and restarting the multiphase inverter by the gate signal.

2. The DC power supply device, according to claim 1, wherein,
in the suspend control for establishing the short circuit between the positive terminal and the negative terminal in the bridge circuit,
the controller has a function for suspending generation of a pulse control signal according to pulse width control, and
outputting as the gate signal, an OR output of both pulse control signals; the pulse control signal upon suspending and the pulse control signal for turning all the switching elements to ON state on the negative terminal side in the bridge circuit.

3. The DC power supply device, according to claim 1, wherein,
in the suspend control for establishing the short circuit between the positive terminal and the negative terminal in the bridge circuit,
the controller has a function for outputting to the positive terminal side arm in the bridge circuit, the gate signal in the gate signal state, being the same as the gate signal state upon suspending on the positive terminal side, in a pair of the arms respectively on the positive terminal side and on the negative terminal side in the bridge circuit, and outputting to the switching element on the negative terminal side arm being the counterpart of the switching element on the positive terminal side arm in the bridge circuit, being ON state upon suspending, the pulse control signal as the gate signal for turning the switching element on the negative terminal side arm to ON state.

4. The DC power supply device, according to claim 2, wherein,
  in the resume control, the controller suspends the pulse control signal for turning all the switching elements to ON state, on the negative terminal arms in the bridge circuit,
  resuming generation of the gate signal for each switching element based on the gate signal state upon suspending, and
  outputting the gate signals to the switching elements respectively on the positive terminal side arm and on the negative terminal side arm.

5. The DC power supply device, according to claim 3, wherein,
  in the resume control, the controller suspends the pulse control signal for turning the switching elements being in the pair to ON state, respectively on the positive terminal side arm and on the negative terminal side arm of the bridge circuit,
  resuming generation of the gate signal for each switching element, based on the gate signal state upon suspending, and
  outputting the gate signals to the switching elements respectively on the positive terminal side arm and on the negative terminal side arm.

6. The DC power supply device, according to claim 1, further comprising an arc detector, assuming an arc generator as a load and detecting an arc state of the arc generator, wherein,
  in the suspend control and in the resume control, the controller performs control for stopping the DC output based on detection of arc occurrence by the arc detector, and performs control for resuming the DC output, based on the detection of arc extinction by the arc detector or a lapse of holding time which is settable to any period of time.

7. The DC power supply device, according to claim 2, further comprising an arc detector, assuming an arc generator as a load and detecting an arc state of the arc generator, wherein,
  in the suspend control and in the resume control, the controller performs control for stopping the DC output based on detection of arc occurrence by the arc detector, and performs control for resuming the DC output, based on the detection of arc extinction by the arc detector or a lapse of holding time which is settable to any period of time.

8. The DC power supply device, according to claim 3, further comprising an arc detector, assuming an arc generator as a load and detecting an arc state of the arc generator, wherein,
  in the suspend control and in the resume control, the controller performs control for stopping the DC output based on detection of arc occurrence by the arc detector, and performs control for resuming the DC output, based on the detection of arc extinction by the arc detector or a lapse of holding time which is settable to any period of time.

9. The DC power supply device, according to claim 4, further comprising an arc detector, assuming an arc generator as a load and detecting an arc state of the arc generator, wherein,
  in the suspend control and in the resume control, the controller performs control for stopping the DC output based on detection of arc occurrence by the arc detector, and performs control for resuming the DC output, based on the detection of arc extinction by the arc detector or a lapse of holding time which is settable to any period of time.

10. The DC power supply device, according to claim 5, further comprising an arc detector, assuming an arc generator as a load and detecting an arc state of the arc generator, wherein,
  in the suspend control and in the resume control, the controller performs control for stopping the DC output based on detection of arc occurrence by the arc detector, and performs control for resuming the DC output, based on the detection of arc extinction by the arc detector or a lapse of holding time which is settable to any period of time.

11. A control method for DC power supply device, the DC power supply device comprising a current source chopper forming a direct current source, a multiphase inverter for converting a DC output from the current source chopper into multiphase AC power by operating multiple switching elements, a rectifier for subjecting an output from the multiphase inverter to AC-DC conversion to supply direct current being obtained to a load, and a controller for controlling the current source chopper and the multiphase inverter, the method allowing the controller to perform,
  suspend and resume control for controlling suspend and resume of the DC output according to following control; suspend control, suspend holding control, and resume control;
  the suspend control for switching a main switch of the current source chopper from ON state to OFF state, upon suspending the DC output from the DC power supply device, and suspending generation of a gate signal for a bridge circuit constituting the multiphase inverter simultaneously with establishing a short circuit between a positive terminal and a negative terminal of the bridge circuit,
  the suspend holding control for holding, under suspension of the DC output from the DC power supply device, the OFF state of the main switch of the current source chopper and the short circuit state between the positive terminal and the negative terminal in the bridge circuit, and holding a phase of a gate signal state of the bridge circuit to be the same as a phase of the gate signal state upon suspending, and
  the resume control for switching the main switch of the current source chopper from OFF state to ON state, resuming the generation of the gate signal for the bridge circuit based on the phase of the gate signal state upon suspending, and restarting the multiphase inverter by the gate signal.

12. The control method for DC power supply device, according to claim 11, wherein,
  the controller performs,
  the suspend control to suspend the DC output based on a voltage drop of the load,
  the suspend holding control to hold suspending of the DC output, based on continuation of the voltage drop of the load or a holding time that is settable to any period of time, and
  the resume control to resume the DC output based on voltage recovery from the voltage drop of the load or a lapse of the holding time.

13. The control method for DC power supply device, according to either of claim 11, wherein,
  the controller controls the bridge circuit constituting the multiphase inverter, the suspend control suspends, upon suspending the DC output from the DC power supply device, generation of the pulse control signal according to the pulse width control, and outputs as the gate signal, an OR output of both pulse control signals; the pulse control signal upon suspending and the pulse control signal for turning all the switching elements to ON state on the negative terminal side of the bridge circuit, the suspend holding control continuously outputs, under suspension of the DC output from the DC power supply device, the gate signal upon suspending, and the resume control resumes, upon resuming the DC output from the DC power supply device, the generation of the pulse control signal for the bridge circuit, based on the state of the pulse control signal upon suspending, and outputs the pulse control signal as the gate signal.

14. The control method for DC power supply device, according to either of claim 12, wherein, the controller controls the bridge circuit constituting the multiphase inverter, the suspend control suspends, upon suspending the DC output from the DC power supply device, generation of the pulse control signal according to the pulse width control, and outputs as the gate signal, an OR output of both pulse control signals; the pulse control signal upon suspending and the pulse control signal for turning all the switching elements to ON state on the negative terminal side of the bridge circuit, the suspend holding control continuously outputs, under suspension of the DC output from the DC power supply device, the gate signal upon suspending, and the resume control resumes, upon resuming the DC output from the DC power supply device, the generation of the pulse control signal for the bridge circuit, based on the state of the pulse control signal upon suspending, and outputs the pulse control signal as the gate signal.

15. The control method for DC power supply device, according to either of claim 11, wherein, the controller controls the bridge circuit constituting the multiphase inverter, the suspend control suspends, upon suspending the DC output from the DC power supply device, generation of the pulse control signal according to the pulse width control, outputs as the gate signal, the pulse control signal upon suspending on the positive terminal side, to the positive terminal side arm of the bridge circuit, and outputs as the gate signal, the pulse control signal which turns the switching element on the negative terminal side arm to ON state, being in pair with the switching element being ON state upon suspending on the positive terminal side arm in the bridge circuit, among the pairs of the positive terminal side arm and the negative terminal side arm in the bridge circuit, the suspend holding control continuously outputs, under suspension of the DC output from the DC power supply device, the gate signal upon suspending, and the resume control restarts, upon resuming the DC output from the DC power supply device, the generation of the pulse control signal for the bridge circuit, based on the state of the pulse control signal upon suspending, and outputs the pulse control signal as the gate signal.

16. The control method for DC power supply device, according to either of claim 12, wherein, the controller controls the bridge circuit constituting the multiphase inverter, the suspend control suspends, upon suspending the DC output from the DC power supply device, generation of the pulse control signal according to the pulse width control, outputs as the gate signal, the pulse control signal upon suspending on the positive terminal side, to the positive terminal side arm of the bridge circuit, and outputs as the gate signal, the pulse control signal which turns the switching element on the negative terminal side arm to ON state, being in pair with the switching element being ON state upon suspending on the positive terminal side arm in the bridge circuit, among the pairs of the positive terminal side arm and the negative terminal side arm in the bridge circuit, the suspend holding control continuously outputs, under suspension of the DC output from the DC power supply device, the gate signal upon suspending, and the resume control restarts, upon resuming the DC output from the DC power supply device, the generation of the pulse control signal for the bridge circuit, based on the state of the pulse control signal upon suspending, and outputs the pulse control signal as the gate signal.

* * * * *